(12) United States Patent
Young

(10) Patent No.: US 6,278,290 B1
(45) Date of Patent: Aug. 21, 2001

(54) METHOD AND CIRCUIT FOR OPERATING PROGRAMMABLE LOGIC DEVICES DURING POWER-UP AND STAND-BY MODES

(75) Inventor: Steven P. Young, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/374,490

(22) Filed: Aug. 13, 1999

(51) Int. Cl.$^7$ .......................... H01L 25/00; H03K 19/177
(52) U.S. Cl. ................................ 326/41; 326/38; 326/39; 326/113
(58) Field of Search .................. 326/38, 39, 40, 326/41, 42, 46, 113

(56) References Cited

U.S. PATENT DOCUMENTS

| | | | |
|---|---|---|---|
| 4,870,302 | * 9/1989 | Freeman | 326/41 |
| 4,912,348 | * 3/1990 | Maki et al. | 326/41 |
| 5,059,828 | * 10/1991 | Tanagawa | 326/40 |
| 5,537,057 | * 7/1996 | Leong et al. | 326/41 |
| 5,760,604 | * 6/1998 | Pierce et al. | 326/41 |
| 5,914,616 | * 6/1999 | Young et al. | 326/41 |
| 5,942,913 | 8/1999 | Young et al. | 326/41 |

* cited by examiner

Primary Examiner—Michael Tokar
Assistant Examiner—Steven S. Paik
(74) Attorney, Agent, or Firm—Patrick T. Bever

(57) ABSTRACT

A PLD includes buffered interconnect resources and configurable logic circuits that are controlled by data stored in a configuration memory. Each buffer of the buffered interconnect resources includes a feedback pull-up transistor. To avoid crowbar current problems, a high voltage is transmitted to the input terminals of all buffers before configuration, thereby biasing all buffers into a high feedback voltage mode. In one embodiment, the high voltage is transmitted to the buffers using a global control signal that forces all output drivers to generate high output voltages, and then turning on all pass transistors of the interconnect resources to broadcast the high voltages to every buffer. After configuration, the global control signal is de-activated. In another embodiment, each buffer circuit includes a second pull-up device that is turned on at power-up to force all buffers into the high feedback mode. In this embodiment, all pass transistors of the interconnect resources are turned off before configuration. In yet another embodiment, another global control signal is transmitted to all state devices of the PLD at the beginning of a stand-by/reconfiguration mode. In response to the additional control signal, all state devices ignore subsequent signals from the interconnect resources until configuration is completed and all output drivers are returned to their pre-stand-by operation state.

16 Claims, 8 Drawing Sheets

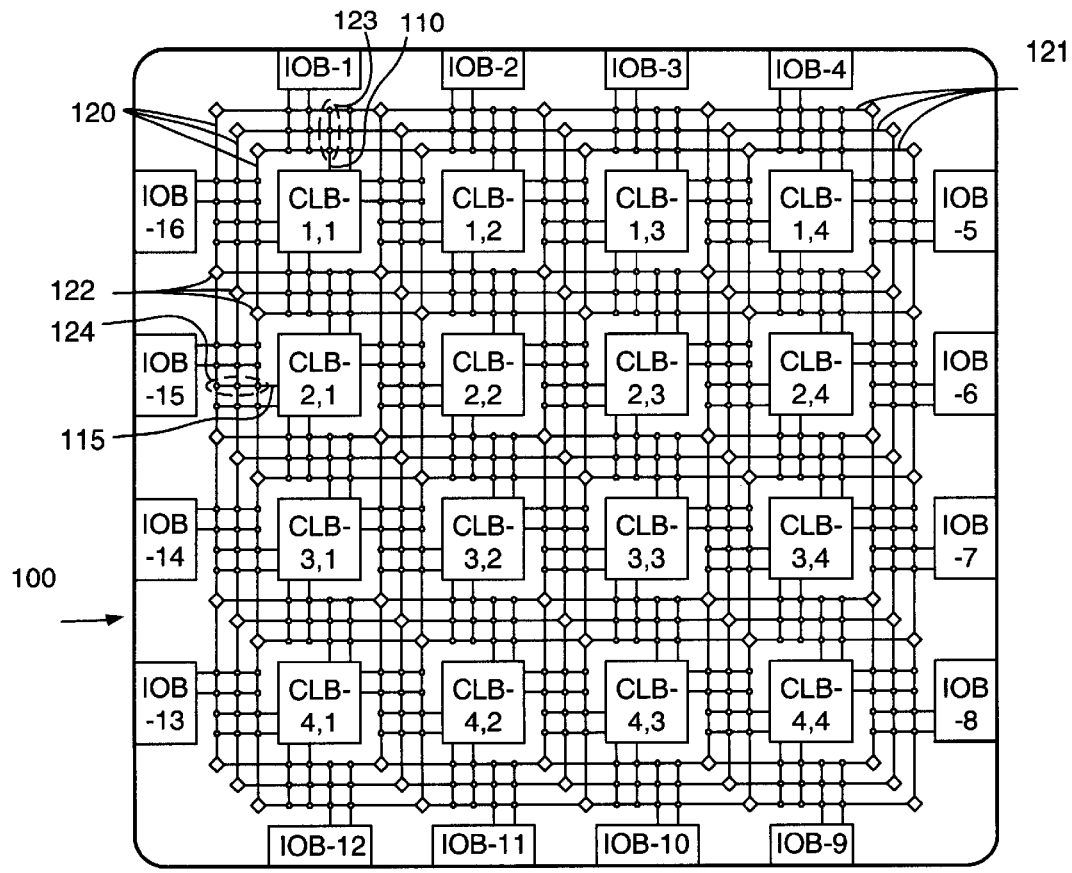
FIG. 1(A)
(PRIOR ART)
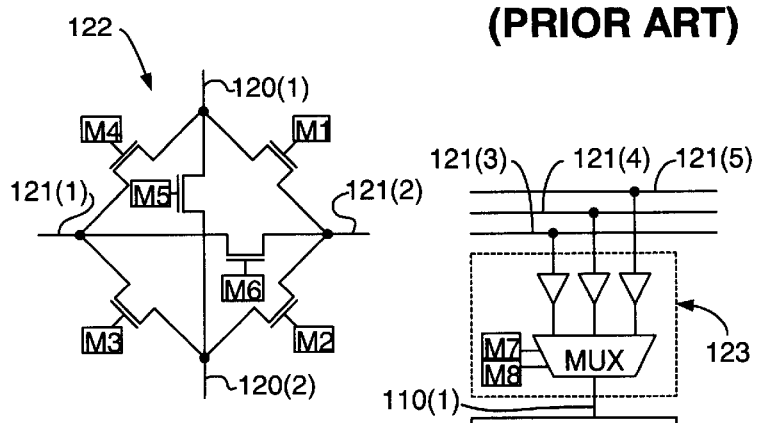
FIG. 1(B)
(PRIOR ART)
FIG. 1(C)
(PRIOR ART)
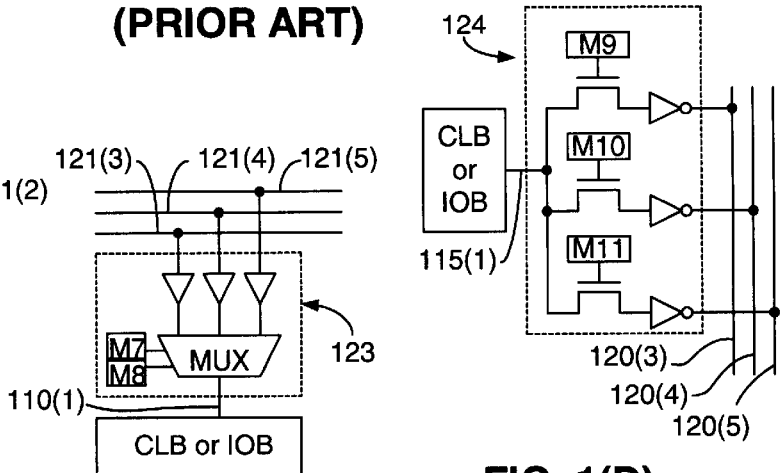
FIG. 1(D)
(PRIOR ART)

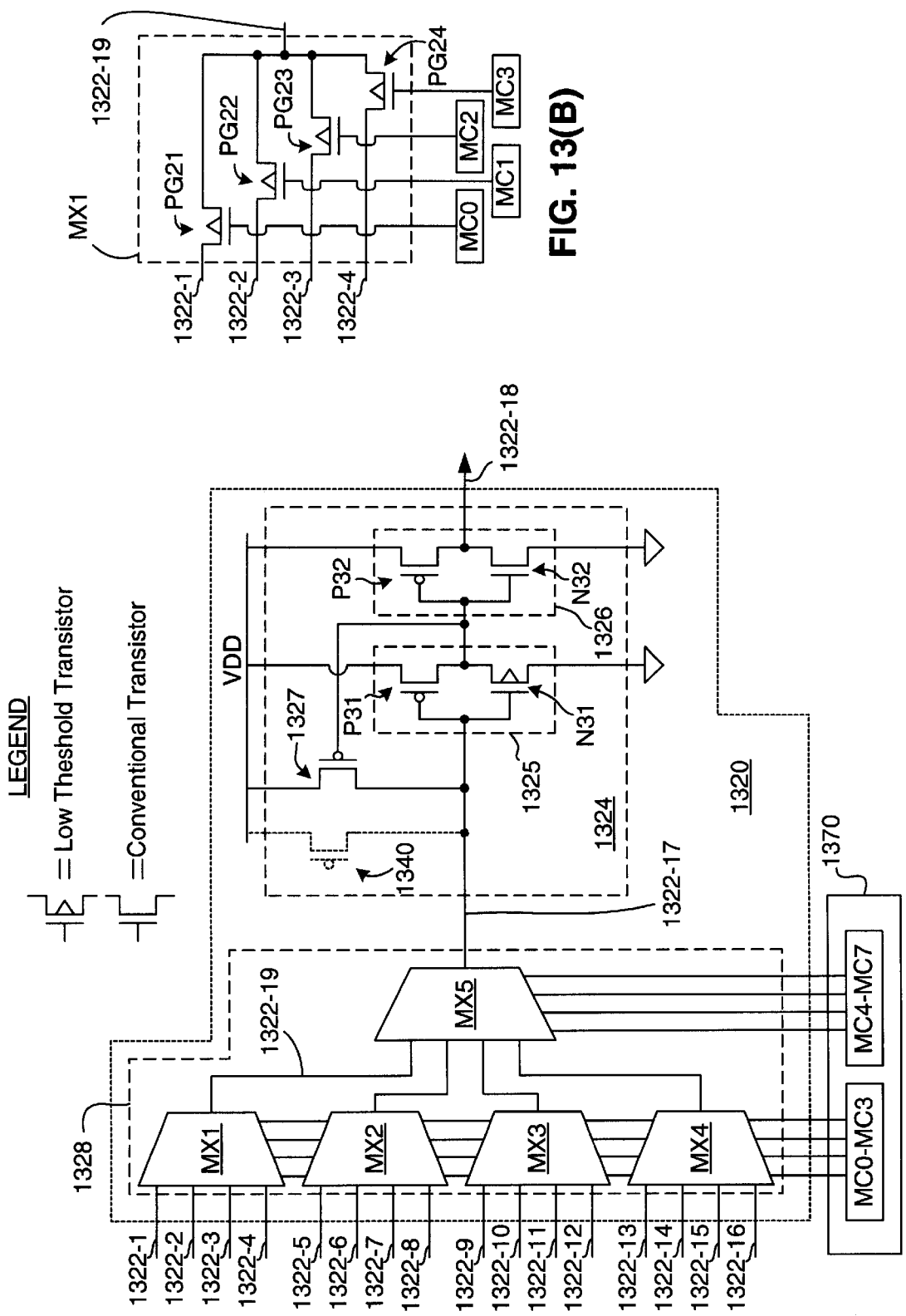

METHOD AND CIRCUIT FOR OPERATING PROGRAMMABLE LOGIC DEVICES DURING POWER-UP AND STAND-BY MODES

CROSS-REFERENCE TO RELATED APPLICATIONS

This application relates to commonly assigned, concurrently filed U.S. patent application Ser. No. 09/374,434 [X-478 US] invented by David P. Schultz, Lawrence C. Hung, and F. Erich Goetting entitled "METHOD AND STRUCTURE FOR CONFIGURING FPGAS", which is incorporated herein by reference.

This application further relates to commonly assigned, co-pending U.S. patent application Ser. No. 08/821,263 invented by Steven P. Young, Trevor J. Bauer, Kamal Chaudhary, and Sridhar Krishnamurthy entitled "FPGA Repeatable Interconnect Structure with Bidirectional and Unidirectional Interconnect Lines", filed Mar. 20, 1997, which is incorporated herein by reference.

FIELD OF THE INVENTION

The present invention relates to programmable logic devices, and more particularly to programmable logic devices incorporating low threshold voltage (low $V_{th}$) transistors.

BACKGROUND OF THE INVENTION

Programmable logic devices (PLDs) typically include a plurality of logic elements and associated interconnect resources that are programmed by a user to implement user-defined logic operations (that is, a user's circuit). PLDs are programmed using a personal computer or workstation, appropriate software and in some cases a device programmer. Therefore, unlike application specific integrated circuits (ASICs) that require a protracted layout process and an expensive fabrication process to implement a user's logic operation, a PLD may be utilized to implement the logic operation in a relatively quick and inexpensive manner.

FIG. 1(A) is a simplified diagram showing a basic Field Programmable Gate Array (FPGA) 100, which is a type of PLD. FPGA 100 includes an array of configurable logic blocks (CLBs) CLB-1,1 through CLB-4,4 that are surrounded by input/output blocks (IOBs) IOB-1 through IOB-16, and programmable interconnect resources that include vertical interconnect wiring segments 120 and horizontal interconnect wiring segments 121 extending between the rows and columns of CLBs and IOBS. Each CLB includes configurable combinational circuitry and optional output registers that are programmed to implement a portion of a user's logic function. The interconnect wiring segments of the programmable interconnect resources are configured using various switches to generate signal paths between the CLBs that link the logic function portions. Each IOB is similarly configured to selectively utilize an associated pin (not shown) of FPGA 100 either as a device input pin, a device output pin, or a bi-directional pin. Although greatly simplified, FPGA 100 is generally consistent with FPGAs that are produced, for example, by Xilinx, Inc. of San Jose, Calif.

FIGS. 1(B) through 1(D) are simplified diagrams showing examples of the various switches associated with the programmable interconnect resources of FPGA 100. FIG. 1(B) shows an example of a six-way segment-to-segment switch 122 that selectively connects vertical wiring segments 120 (1) and 120(2) and horizontal wiring segments 121(1) and 121(2) in accordance with configuration data stored in memory cells M1 through M6. Alternatively, if horizontal and vertical wiring segments 120 and 121 do not break at an intersection, a single transistor makes the connection. FIG. 1(C) shows an example of a segment-to-CLB/IOB input switch 123 that selectively connects an input wire 110(1) of a CLB (or IOB) to one or more interconnect wiring segments in accordance with configuration data stored in memory cells M7 and M8. FIG. 1(D) shows an example of a CLB/IOB-to-segment output switch 124 that selectively connects an output wire 115(1) of a CLB (or IOB) to one or more interconnect wiring segments in accordance with configuration data stored in memory cells M9 through M11.

Signal Contention Problem

FIG. 2(A) is a simplified schematic showing one row of CLBs of FPGA 100 (see FIG. 1(A)). As indicated in FIG. 2(A), CLB-1,1 is programmably connected to wiring segment 121(1) via CLB-to-segment output switch 124(1), and CLB-1,2 is programmably connected to wiring segment 121(2) via CLB-to-segment output switch 124(2). Wiring segments 121(1) and 121(2) are programmably connected via segment-to-segment switch 122(1).

When power is initially applied to a typical PLD (referred to below as "power-up"), the configuration memory cells of the PLD "wake up" in random states. These random states sometimes cause the configurable logic circuits (e.g., IOBs and CLBs) to transmit opposing (i.e., high and low voltage) signals onto the wiring segments of the interconnect resources. A signal contention problem occurs when the sources of these opposing signals are linked through the interconnect resources, thereby potentially damaging and/or locking-up the PLD.

FIG. 2(B) shows a relevant portion of the CLB row of FIG. 2(A), and illustrates an example of a power-up signal contention problem between CLB-1,1 and CLB-1,2 (see FIG. 2(A)). The present example assumes that the internal circuitry of CLB-1,1 "wakes up" in a state that transmits a high (VDD) output signal to CLB-to-segment output switch 124(1). Conversely, the internal circuitry of CLB-1,2 "wakes up" in a state that transmits a low (GND) output signal to CLB-to-segment output switch 124(2). In addition, the present example assumes that memory cells M11 of CLB-to-segment output switches 124(1) and 124(2) "wake up" to pass these high and low signals to wiring segments 121(1) and 121(2), respectively. Finally, the present example assumes that memory cell M6 of segment-to-segment switch 122(1) "wakes up" in a state that turns on its associated pass transistor to connect wiring segments 121(1) and 121(2). Based on the "wake up" states provided above, signal contention is generated between VDD CLB-1,1 and GND CLB-1,2 that can potentially damage and/or create unacceptably high current in FPGA 100.

Signal contention can also occur after device power-up in PLDs that support reconfiguration. Reconfiguration typically includes deactivation of the PLD (which operates according to "old" configuration data), writing "new" reconfiguration data into the configuration memory, and then re-activating the PLD such that it operates according to the "new" configuration data. Signal contention can occur during this reconfiguration process while the "new" configuration data is being written into the configuration memory. Specifically, signal contention can occur while the configuration memory contains some "old" configuration data and some "new" configuration data (i.e., while the new configuration data is being written into configuration memory). For example, referring to FIG. 2(B), assume the "old" configuration data causes CLB-1,1 to transmit a high (VDD) output signal to CLB-to-segment output switch 124(1), causes CLB-to-segment output switch 124(1) to pass this high signal to wiring segment 121(1), and causes segment-to-segment switch 122(1) to connect wiring segments 121(1) and 121(2). If this "old" configuration data is still stored in the configuration memory when "new" configuration data is written that causes CLB-to-segment output switch 124(2) to transmit a low (GND) output signal from CLB-1,2 to interconnect wiring segment 121(2), then signal contention is generated between VDD CLB-1,1 and GND CLB-1,2 that can potentially damage and/or create unacceptably high current in FPGA 100.

A well-known mechanism for preventing signal contention at device power-up is to fabricate a PLD using asymmetric transistors that are biased to "wake up" in a known state. However, such asymmetric transistors are unreliable, and also require significantly more area than symmetric transistors.

Crowbar Current Problem

FIG. 2(C) is a simplified schematic showing another portion of FPGA 100 of FIG. 1(A), and illustrates an example of how buffers utilized in the interconnect resources of some PLDs can create a significant crowbar current problem. FIG. 2(C) shows a portion of the interconnect resources of FPGA 100 including interconnect wiring segments 121(3) and 121(4) that are programmably connected by a pass transistor 210 of segment-to-segment switch 122(2), and a buffer circuit 220 that is connected between interconnect wiring segment 121(4) and an input terminal of CLB-X,Y. Buffer circuit 220 includes a CMOS inverter 225 having a P-channel transistor P1 and an N-channel transistor N1, each having a gate terminal connected to interconnect wiring segment 121(4). During operation of FPGA 100, logic signals (e.g., VDD or ground) are transmitted from interconnect wiring segment 121(3) onto interconnect wiring segment 121(4) via pass transistor 210 when configuration memory cell M6 transmits a high voltage to the gate terminal of pass transistor 210.

A "crowbar current" (also called a "short-circuit current") is the current that flows from a P-channel transistor to an N-channel transistor while the input signal driving both transistors is at an intermediate voltage (i.e., both transistors are partially on). A crowbar current undesirably consumes extra power and does not contribute to charging the output node. A crowbar current is generated in buffer 220 during operation of FPGA 100 that is due to the voltage drop across the pass transistors of the interconnect resources. As shown in FIG. 2(C), when a high (VDD) voltage level is transmitted on interconnect wiring segment 121(3) that is passed by pass transistor 210 to interconnect wiring segment 121(4), the voltage level on interconnect wiring segment 121(4) (VDD−VTH) is one N-channel transistor threshold voltage (i.e., one VTH) lower than the voltage level on interconnect wiring segment 121(3). Because the voltage applied to the gate terminal of P-channel transistor P1 of inverter 225 is less than VDD, a crowbar current is generated in buffer 220. The cumulative effect of the crowbar current from all buffers of FPGA 100 can be very significant.

To prevent crowbar current from buffer 220, a feedback pull-up P-channel transistor P2 is utilized to pull up the input of inverter 225 to VDD (i.e., when a high voltage level is transmitted on interconnect wiring segment 121(3)). Pull-up transistor P2 is connected between VDD and the input terminal of inverter 225, and has a gate terminal connected to the output terminal of inverter 225. When a high voltage signal is applied to the input terminal of inverter 225, the output terminal is pulled low by N-channel transistor N1. This low voltage level at the output terminal turns on pull-up P-channel transistor P2, thereby pulling up the input terminal to VDD. Therefore, crowbar current through P-channel transistor P1 is prevented by pull-up transistor P2 because the voltage level applied to the gate terminal of transistor P1 is VDD.

Although pull-up P-channel transistor P2 prevents crowbar current from active buffers, it may not prevent crowbar current that occurs in buffers connected to unused interconnect wiring segments of FPGA 100. Referring again to FIG. 2(C), assume that interconnect wiring segment 121(4) is not utilized by a user's logic function. Therefore, during operation of FPGA 100, no logic signals are passed to interconnect wiring segment 121(4), thereby allowing it to float between ground and the system voltage. This intermediate (floating) voltage on interconnect wiring segment 121(4) is applied to inverter 225. Because the voltage level at the input terminal of inverter 225 is neither high nor low, both N-channel transistor N1 and P-channel transistor P1 are partially turned on. The voltage level at the output terminal may be insufficient to sufficiently turn on pull-up transistor P2. Therefore, a crowbar current can be generated through P-channel transistor P1 in every unused buffer of FPGA that is connected to a floating interconnect wiring segment.

In conventional PLDs, the floating interconnect wire problem is addressed by "tying" all unused interconnect wiring segments to a common voltage source. This "tying" process is performed by determining a supplemental routing solution (i.e., in additional to the routing solution needed to implement the user's logic function). In one embodiment, the supplemental routing solution is used to connect all unused interconnect wires to VDD, thereby fully turning off P-channel transistor P1 (and fully turning on N-channel transistor N1 and pull-up transistor P2) in all buffers connected to the unused interconnect wiring segments.

A problem with the "tying" process is that it is very time-consuming to generate the supplemental routing solution, thereby increasing the time required to program a PLD. Further, it is not always possible to generate a supplemental solution that ties all unused interconnect wires to VDD (i.e., some inaccessible interconnect wires are left floating). Moreover, the "tying" process does not address signal contention at device power-up.

Low Voltage Threshold Transistors

While PLDs provide numerous advantages over application specific integrated circuits (ASICs), signal propagation through the general interconnect resources of PLDs is typically slower than through the dedicated hard-wired connections found in an ASIC. Therefore, PLD manufacturers strive to utilize the most advanced fabrication technologies available to provide the fastest possible products.

Recent fabrication technology advances have provided low threshold voltage (low $V_{th}$), high-speed transistors. Low $V_{th}$ transistors are fabricated by altering the semiconductor process parameters (e.g., by altering the amount of diffused dopant) in accordance with known techniques.

A problem with low $V_{th}$ transistors is that they tend to leak excessively when, in the case of N-channel transistors, they are turned off (i.e., 0 volts is applied to the gate terminal). This characteristic makes low $V_{th}$ transistors poorly suited for PLDs because numerous pass gates remain turned off (e.g., throughout the interconnect resources of FPGA 100, described above) when the PLD is programmed to implement a user's logic function.

Therefore, what is needed is a method for overcoming the start-up contention problems of conventional FPGAs, described above. What is also needed is a method/circuit that minimizes crowbar current and leakage both from used and from unused interconnect resources of the PLD without the need to generate a supplemental routing solution. Further, what is needed is a method/circuit that supports the efficient use of low $V_{th}$ transistors in PLDs.

SUMMARY OF THE INVENTION

The present invention is directed to methods and circuits for controlling a programmable logic device (PLD) having buffered interconnect resources that prevent the crowbar current problems and signal contention problems in the interconnect resources at device power-up and at the beginning of stand-by/reconfiguration modes, thereby preventing damage and/or unacceptably high currents in the PLD. These methods and circuits are also utilized to support the use of low $V_{th}$ transistors by selectively biasing unused interconnect wires during normal operation of the PLD.

In accordance with the present invention, a high voltage is applied to the input terminal of each buffer of the buffered interconnect resources at power-up or at the beginning of a stand-by/reconfiguration mode of the PLD. Each buffer includes a pull-up device that pulls up the input terminal of the buffer in response to the high voltage, and maintains this pulled-up state (default high feedback mode) until a low voltage is transmitted to the input terminal of the buffer. Subsequently, configuration data is transmitted to the PLD that selectively turns on/off the pass transistors of the buffered interconnect resources. The unused interconnect wires of the interconnect resources (i.e., those connected between a turned-off transistor and a buffer) remain pulled-up by the pull-up device of the buffer. Therefore, the crowbar current problem (discussed above) is avoided without requiring a supplemental routing solution that ties the unused interconnect wires to a high voltage level.

In accordance with a first embodiment of the present invention, a global control signal is generated at device power-up and prior to each stand-by mode that is transmitted to the configurable logic circuits (e.g., the CLBs and IOBs) of a PLD. The global control signal causes output drivers of the configurable logic circuits to transmit a high voltage onto the interconnect resources of the PLD. Subsequently, all of the pass transistors in the interconnect resources of the PLD are turned on to transmit the high voltage to all of the buffers, thereby placing the buffers in the default high feedback mode. Signal contention is prevented because all of the output drivers and all of the buffers connected to the interconnect wires are biased to transmit the same high voltage. Subsequently, configuration data is written to the configuration memory of the PLD that turns off some of the pass transistors to prevent signal transmission onto unused interconnect wires (and to isolate adjacent interconnect wires that are part of different signal paths) during operation of the PLD. After configuration is completed, the global control signal is turned off, thereby allowing the PLD to operate in accordance with a user's logic function implemented by the configuration data. However, because the pull-up device in each buffer maintains the default high feedback mode, a high voltage is maintained in all of the unused interconnect wires, thereby avoiding the crowbar current problem (described above) without requiring a supplemental routing solution to pull up all of the unused interconnect wires.

In accordance with a second embodiment of the present invention, a PLD includes buffered interconnect resources made up of buffers connected between pairs of interconnect wires, each buffer including first and second pull-up transistors connected to the input terminal of the buffer. The buffer also includes series-connected first and second inverters. The first pull-up transistor is a P-channel device that includes a first terminal connected to a system voltage source, a second terminal connected to the input terminal of the first inverter, and a gate connected to a node located between the first and second inverters. Consequently, when a high voltage is applied to the input terminal of the first inverter, the first inverter generates a low voltage that is applied to the gate of the first pull-up transistor, thereby turning on the first pull-up transistor and feeding back the high voltage to the input terminal (i.e., forcing the buffer into the default high feedback mode). The second pull-up transistor also includes a first terminal connected to the system voltage source, and a second terminal connected to the input terminal of the first inverter. However, the gate terminal of the second pull-up transistor is connected to a control signal source that selectively turns on the second pull-up transistor during power-up or at the start of stand-by/reconfiguration modes. Accordingly, all buffers connected to unused interconnect wires can be selectively biased into the default high feedback mode to apply high voltages onto the unused interconnect wires, thereby avoiding the crowbar current problem (described above) without requiring a supplemental routing solution to pull up all of the unused interconnect wires.

In accordance with a third embodiment of the present invention, at device power-up and prior to each stand-by mode all of the pass transistors in the interconnect resources of a PLD are turned off, and first and second control signals are generated that are transmitted to the configurable logic circuits and the interconnect buffers of the PLD. Turning off all of the pass transistors in the interconnect resources prevents signal contention problems, because all potential contending signals are separated by the turned-off (i.e., open) pass transistors. The first control signal causes output drivers of the configurable logic circuits to apply a first signal having a high voltage level onto the interconnect resources of the PLD, thereby further insuring against signal contention while the pass transistors are turning off, and preventing signal contention as selected pass transistors are turned on during the subsequent configuration process. The second control signal causes a high voltage to be transmitted to the input terminals of all of the buffers, thereby biasing all of the buffers into the default high feedback mode. The second control signal is de-asserted after all of the pass transistors in the interconnect resources of the PLD are turned off (i.e., all of the interconnect wires are isolated). Note that all of the interconnect wires connected to both the input terminals and the output terminals of the buffers remain at the high voltage after de-assertion of the second control signal due to the feedback transistors provided in each buffer, thereby avoiding the crowbar current problem. Subsequently, configuration data is written to the configuration memory of the PLD that turns on selected pass transistors to form a signal routing network through the interconnect resources during operation of the PLD. Other pass transistors remain turned off to prevent signal transmission to unused interconnect wires. Because of the pull-up transistors in each buffer, a high voltage is maintained in all of the unused interconnect wires, thereby avoiding the crowbar current problem without requiring a supplemental routing solution to pull up all of the unused interconnect wires. After configuration is completed, the first control signal is turned off, thereby allowing the PLD to operate in accordance with a user's logic function implemented by the configuration data.

In accordance with a fourth embodiment of the present invention, the first control signal and a third control signal are sequentially generated at the beginning of a stand-by/reconfiguration mode that are transmitted to the configurable logic circuits of a PLD. The third control signal de-activates all state devices of the configurable logic circuits, thereby preventing these state devices from changing state. The first control signal causes output drivers of the configurable logic circuits to transmit a high voltage onto the interconnect resources of the PLD. At this stage reconfiguration data may be written to the configuration memory of the PLD to reconfigure the interconnect resources. After reconfiguration is completed, the first control signal is de-asserted, thereby allowing the output drivers to transmit signals consistent either with the pre-standby state, or with the new logic function implemented by reconfiguration data. Subsequently, the third control signal is de-asserted, thereby enabling the state devices to change state in accordance with the logic signals received from the interconnect resources. Because the third control signal de-activates the state devices of the PLD prior to the stand-by/reconfiguration mode, all data stored in the state devices is preserved when the subsequent high voltage is transmitted through the interconnect resources. Therefore, the PLD "wakes up" from a stand-by mode in the same state as when the stand-by mode begins. Alternatively, partial reconfiguration of the PLD can be performed without changing the data stored in non-reconfigured portions of the PLD.

In accordance with a fifth embodiment of the present invention, the buffered interconnect resources of a PLD include low threshold voltage (low $V_{TH}$) transistors to facilitate faster operating speeds. In particular, all pass transistors utilized in the switches of the interconnect resources are formed using low $V_{TH}$ transistors. Because the various embodiments of the present invention generate high voltages on all unused interconnect wires, the present invention facilitates forming these pass transistors using low $V_{TH}$ transistors because, when turned off, no leakage occurs if the same voltage is applied to both terminals of a low $V_{TH}$ transistor. However, only the N-channel transistor in the first inverter in each buffer of the buffered interconnect resources is a low $V_{TH}$ transistor. In the default high feedback mode, the N-channel transistor of the first inverter remains turned on in series with a turned-off P-channel transistor, and the N-channel transistor of the second inverter is turned off (leaking). Because the N-channel transistor in the first inverter is turned on, it is implemented by a low $V_{TH}$ N-channel transistor, thereby enhancing fast operating speeds. In contrast, because the N-channel transistor in the second inverter remains turned off, the second inverter in each buffer includes a high $V_{TH}$ N-channel transistor (that is, high $V_{TH}$ relative to the low $V_{TH}$ transistor), thereby avoiding high leakage currents when the buffer is in the default high feedback mode.

BRIEF DESCRIPTION OF THE DRAWINGS

FIG. 1(A) is a diagram showing a portion of a simplified prior art FPGA.

FIGS. 1(B), 1(C) and 1(D) are diagrams showing switch circuits utilized to route signals in the FPGA of FIG. 1(A).

FIGS. 13(A) and 13(B) are simplified circuit diagrams showing buffered interconnect resources for a PLD including low threshold voltage transistors.

DETAILED DESCRIPTION OF THE DRAWINGS

The present invention is directed to methods and circuits for controlling Programmable Logic Devices (PLDs). Although the methods and circuit structures of the present invention are described below with particular reference to FPGAs, some or all of the various aspects of the present invention may be beneficially utilized in other types of PLDs. Therefore, the appended claims should not necessarily be limited to FPGAs.

As defined herein, the term "buffered interconnect resources" refers to interconnect resources (e.g., the interconnect wires and switches of FPGA 100; see FIG. 1(A)) in which each interconnect wire is buffered to prevent signal degradation. A simplified description of a PLD having one type of buffered interconnect resources is described below with reference to FIG. 3. A more complete description of buffered interconnect resources is provided in co-owned and co-pending U.S. patent application Ser. No. 08/821,263, entitled "FPGA Repeatable Interconnect Structure with Bidirectional and Unidirectional Interconnect Lines", referenced above.

Figure 2A:
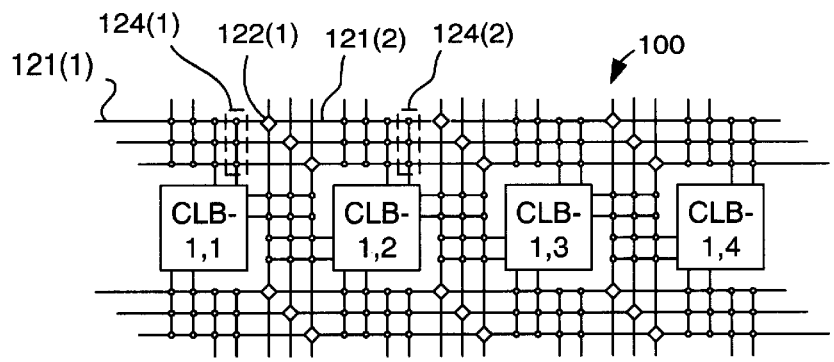
FIGS. 2(A), 2(B) and 2(C) are simplified schematic diagrams showing portions of the FPGA of FIG. 1(A).
Figure 2B:
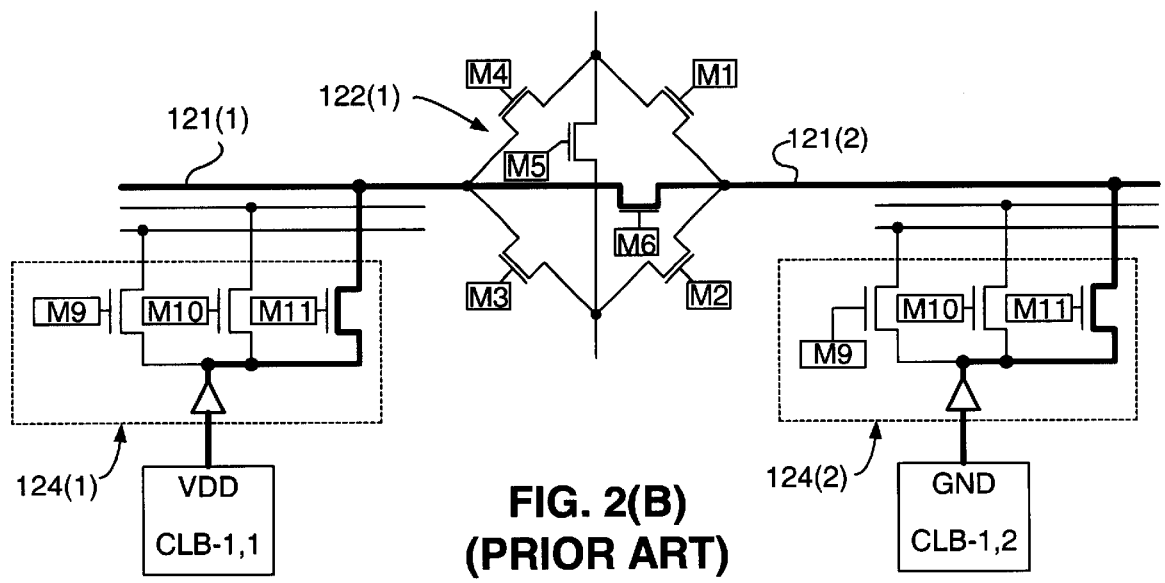
Figure 2C:
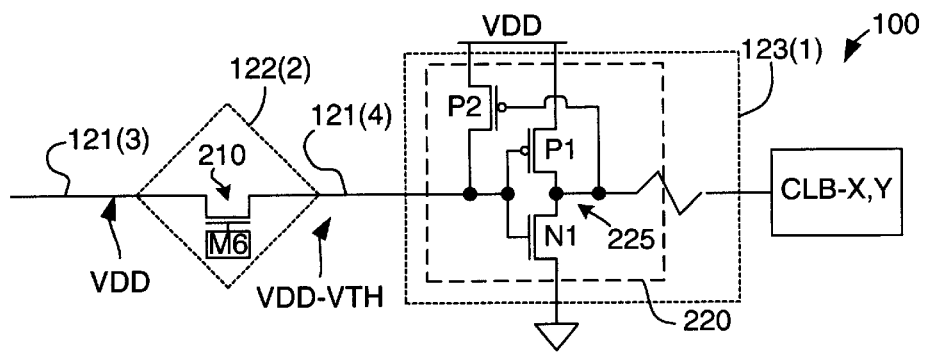
Figure 3:
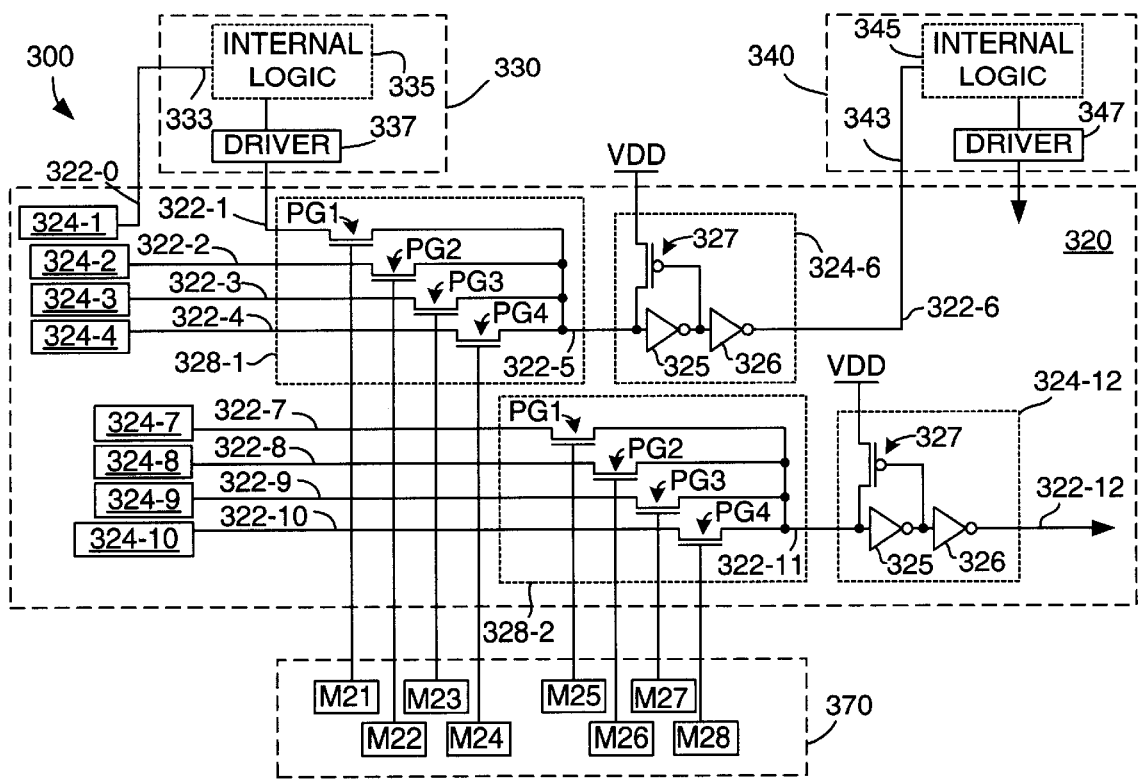
FIG. 3 is a simplified schematic diagram showing a portion of an FPGA including buffered interconnect resources.

FIG. 3 is a simplified diagram showing a portion of a PLD 300 including buffered interconnect resources 320, configurable logic circuits 330 and 340, and configuration memory array 370.

Configurable logic circuits 330 and 340 are similar to the CLBs or IOBs of FPGA 100, which is described above with reference to FIG. 1(A). Configurable logic circuits 330 and 340 include input and output terminals that receive or transmit data signals to interconnect wires of buffered interconnect resources 320. For example, configurable logic circuit 330 includes an input terminal 333 that receives a first data signal from interconnect wire 322-0, internal logic 335 that performs a logic operation using the first data signal in accordance with a user's logic function, and an output driver (driver) 337 for transmitting a second data signal to buffered interconnect resources 320. Similarly, configurable logic circuit 340 includes an input terminal 343 that receives a first data signal from interconnect wire 322-6, internal logic 345 that performs a logic operation using the first data signal in accordance with a user's logic function, and an output driver (driver) 347 for transmitting a second data signal to buffered interconnect resources 320.

Buffered interconnect resources 320 include interconnect wires 322-1 through 322-12, buffers 324-1 through 324-4, 324-6 through 324-10 and 324-12, and switches 328-1 and 328-2.

Similar to the programmable interconnect resources of FPGA 100 (see FIG. 1(A)), interconnect wires 322-1 through 322-12 are conductive segments that are selectively linked in accordance with a user's logic function to form signal paths for transmitting data signals between the various configurable logic circuits of PLD 300. However, buffered interconnect resources 320 are distinguished over the non-buffered programmable interconnect resources of FPGA 100 in that each interconnect wire 322-1 through 322-12 is driven by a buffer (either one of buffers 324-1 through 324-4, 324-6 through 324-10 and 324-12, or output drivers 337 and 347 of configurable logic circuits 330 and 340, respectively). Specifically, interconnect wire 322-0 is connected between buffer 324-1 and input terminal 333 of configurable logic circuit 330. Interconnect wires 322-2 through 322-4 are respectively driven by buffers 324-2 through 324-4, and are connected to switch 328-1. Interconnect wire 322-5 is connected between an output terminal of switch 328-1 and an input terminal of buffer 324-6. Interconnect wire 322-6 is connected between buffer 324-6 and input terminal 343 of configurable logic circuit 340. Interconnect wires 322-7 through 322-10 are respectively driven by buffers 324-7 through 324-10, and are connected to switch 328-2. Interconnect wire 322-11 is connected between an output terminal of switch 328-2 and an input terminal of buffer 324-12. Interconnect wire 322-12 is connected to an output terminal of buffer 324-12. Note that output driver 347 and interconnect wire 322-12 are connected to additional portions (not shown) of buffered interconnect resources 320 in a manner consistent with that shown in FIG. 3.

Each buffer of buffered interconnect resources 320 includes a feedback pull-up P-channel transistor that pulls up the input terminal of each buffer whenever a high voltage signal is transmitted to the buffer. A schematic representation of buffers 324-6 and 324-12 is provided in FIG. 3 to illustrate the operation of these feedback pull-up transistors. For example, buffer 324-6 includes a first inverter 325 having an input terminal connected to interconnect wire 322-5, a second inverter 326 having an input terminal connected to an output terminal of first inverter 325, and a feedback P-channel transistor 327 having a first terminal connected to the input terminal of first inverter 325, a second terminal connected to a system voltage source (VDD), and a gate terminal connected to the output terminal of first inverter 325. When a high voltage signal is applied to the input terminal of buffer 324-6, first inverter 325 generates a low voltage that is applied to the input terminal of second inverter 326 and to the gate terminal of feedback transistor 327. This intermediate low voltage causes feedback transistor 327 to turn on, thereby pulling up the input terminal (and interconnect wire 322-5) to VDD. This pull-up voltage is maintained until a subsequent low voltage is transmitted on interconnect wire 322-5 (i.e., pull-up transistor 327 is relatively weak, so it is overpowered by the low voltage). The intermediate low voltage at the output terminal of first inverter 325 is also transmitted to second inverter 326, thereby causing second inverter 326 to transmit a high voltage on interconnect wire 322-6. In an alternative embodiment (not shown), each "buffer" may omit second inverter 326, or may include one or more additional inverters. Although not shown, buffers 324-1 through 324-4 and 324-7 through 324-10 are identical to buffers 324-6 and 324-12.

Switches 328-1 and 328-2 are similar to multiplexers in that they selectively pass signals from one signal source to an output terminal in accordance with "select" signals received from memory array 370. For example, switch 328-1 includes four pass transistors (pass gates) PG1 through PG4. Pass transistor PG1 includes a first terminal connected to interconnect wire 322-1, a second terminal connected to interconnect wire 322-5, and a gate terminal connected to memory cell M21 of memory array 370. Similarly, pass transistors PG2 through PG4 include first terminals connected to interconnect wires 322-2 through 322-4, respectively, second terminals connected to interconnect wire 322-5, and gate terminals connected to memory cells M22 through M24, respectively. In accordance with a user's logic function (as determined by configuration data stored in memory array 370), signal paths are selectively routed through switches 328-1 and 328-2 from a predetermined source. For example, a data signal is passed from configurable logic element 330 to configurable logic element 340 by storing an appropriate data bit (e.g., logic 1) in memory cell M21 such that pass transistor PG1 is turned on to connect interconnect wires 322-1 and 322-5 (memory cells M22 through M24 store logic 0 to turn off pass transistors PG2 through PG4). Similarly, data signals are passed from any of interconnect wires 322-2 through 322-4 to configurable logic circuit 340 by an appropriate data bit in one of memory cells M22 through M24 such that the corresponding pass transistor is turned on to provide the selected signal path. Alternatively, an interconnect wire may be disconnected from all signal paths (i.e., "unused") by turning off all pass transistors of the switch preceding that interconnect wire. For example, if input terminal 343 of configurable logic circuit 340 is not utilized in a user's logic function, interconnect wires 322-5 and 322-6 are disconnected from other interconnect wires by turning off all pass transistors PG1 through PG4 in switch 328-1 (e.g., storing all logic 0's in memory cells M21 through M24).

Figure 4:
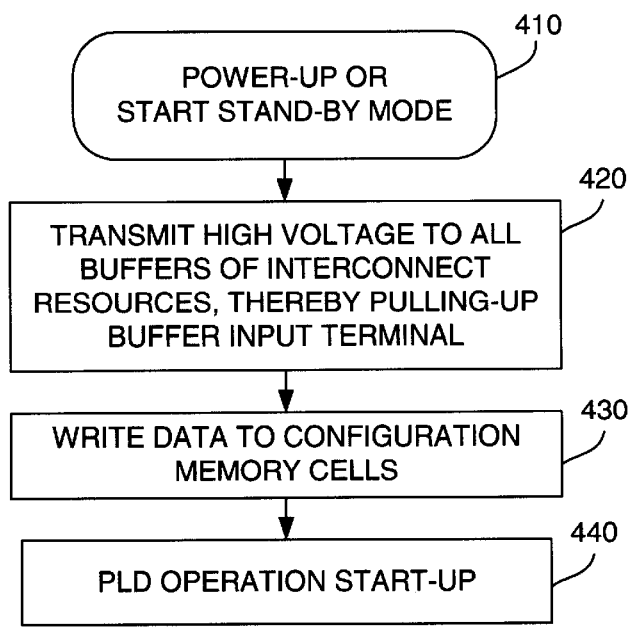
FIG. 4 is a flow diagram showing a method of configuring the FPGA of FIG. 3 in accordance with the present invention.

FIG. 4 is a flow diagram showing a method for controlling PLD 300 to prevent crowbar current problems and signal contention problems in buffered interconnect resources 320 (described above). The method is performed at device power-up and at the beginning of stand-by/reconfiguration modes (Step 410). In accordance with an aspect of the present invention, a high voltage is applied to the input terminal of each buffer 324-1 through 324-4, 324-6 through 324-10 and 324-12, thereby causing each buffer to generate a high feedback signal (Step 420). Specifically, the high voltage applied to the input terminal of first inverter 325 of each buffer turns on the feedback pull-up transistor 327 to pull up the input terminal of the buffer (referred to herein as a "default high feedback mode"). In a first embodiment (described below), the high signal is transmitted to all of the buffers by forcing output drivers 337 and 347 of all configurable logic circuits 330 and 340 to transmit a high voltage, and by turning on all pass transistors of buffered interconnect resources 320. In other embodiments (also described below), a novel buffer circuit utilizes a second pull-up transistor to apply the high voltage to the input terminals of all of the buffers. After buffers 324-1 through 324-4, 324-6 through 324-10 and 324-12 generate high feedback voltages, memory array 370 is programmed to selectively turn on or turn off memory cells M21 through M28, thereby defining signal paths through buffered interconnect resources 320 in accordance with the user's logic function (Step 430). After configuration is completed, PLD operation is initiated (Step 440). Note that, during PLD operation, unused interconnect wires (e.g., interconnect wire 322-5 when pass transistors PG1 through PG4 of switch 328-1 are turned off) remain pulled-up by the feedback transistor 327 of their associated buffer (e.g., buffer 324-6). That is, once an unused interconnect wire is isolated, there is no signal path for transmitting low voltages to overpower the high feedback voltage. Therefore, all buffers connected to unused interconnect wires are pre-set to the system voltage (VDD) by transmitting a high voltage to the inputs of all buffers prior to configuration of PLD 300. Because high voltages are applied to all of these buffers, the crowbar current problem (discussed above) is avoided without requiring a supplemental routing solution that ties the unused interconnect wires to a high voltage level (also discussed above).

The present invention is now described in additional detail with reference to the various embodiments, described below.

First Embodiment-Global High Control Signal

Figure 5:
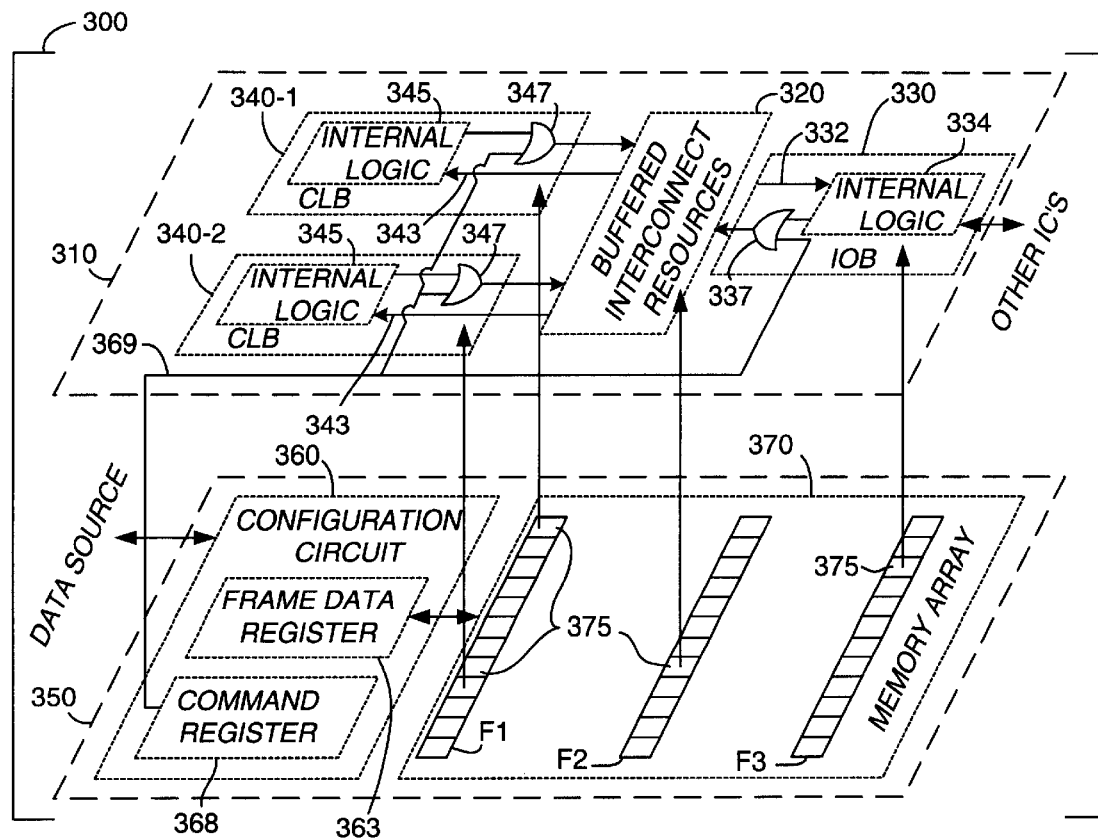
FIG. 5 is an split-level perspective view showing additional details of the FPGA of FIG. 3.

FIG. 5 is a split-level perspective view showing FPGA 300 of FIG. 3 in additional detail. Similar to most PLDs, FPGA 300 includes programmable circuitry formed on a semiconductor substrate that is housed in a package having externally accessible pins. However, to simplify the following description, FPGA 300 is functionally separated into a programmable logic plane 310 and a configuration plane 350. Further simplifications to FIG. 3 that facilitate the following description are mentioned below. Programmable logic plane 310 includes the logic circuitry and signal paths typically associated with a PLD. Configuration plane 350 includes configuration memory and associated control circuits that define the logic and signal paths utilized in programmable logic plane 310. The relationship between programmable logic plane 310 and configuration plane 350 is discussed in further detail below.

Programmable logic plane 310 includes buffered interconnect resources 320 and configurable logic circuits that include input/output blocks (IOBs) 330 and configurable logic blocks (CLBs) 340-1 and 340-2. Buffered interconnect resources 320 are described in detail with reference to FIG. 3 (above).

IOB 330 is one of several IOBs (not shown) that are located around a periphery of FPGA 300 in a manner similar to that indicated in FIG. 1(A). IOB 330 includes an input terminal 332, internal logic 334, and an output driver 337 that is functionally represented as an OR gate having an output terminal connected to buffered interconnect resources 320. In accordance with the first embodiment, before configuration of FPGA 300, a global control signal is applied on control line 369 to one input terminal of output driver 337, thereby causing output driver 337 to transmit a high voltage signal to an associated interconnect wire of buffered interconnect resources 320. Similar output drivers are also turned on in all of the IOBs of FPGA 300. During subsequent normal operations of FPGA 300 (i.e., when IOB 330 is used as an input terminal), the control signal is de-asserted, and output drivers 337 are controlled by data signals transmitted from other integrated circuits (OTHER IC'S) of a user's system to transmit the data signals to buffered interconnect resources 320.

CLBs 340-1 and 340-2 are part of an array of CLBs (not shown) that are arranged in rows and columns in a manner similar that shown in FIG. 1(A). Similar to IOB 330, each CLB 340-1 and 340-2 includes an input terminal 343, internal logic 345, and an output driver 347 having an output terminal connected to buffered interconnect resources 320. Before configuration of FPGA 300, the global control signal transmitted to IOB 330 on control line 369 is also transmitted to output driver 347, thereby causing output driver 347 to transmit a high voltage signal to an associated interconnect wire of buffered interconnect resources 320. Similar output drivers are also turned on in all of the CLBs of FPGA 300. During subsequent normal operations of FPGA 300, the control signal is de-asserted, and output drivers 347 are controlled by internal logic 345 to transmit the data signals to buffered interconnect resources 320.

Referring to the lower portion of FIG. 5, configuration plane 350 includes a configuration circuit 360 and memory array 370. During configuration of FPGA 300, configuration circuit 360 receives configuration instructions and data from a configuration data source (DATA SOURCE). In one embodiment, configuration instructions and data are processed by configuration circuit 360 in accordance with methods disclosed in co-owned and concurrently filed U.S. application Ser. No. 09/374,434, entitled "METHOD AND STRUCTURE FOR CONFIGURING FPGAS", which is referenced above. Briefly described, configuration circuit 360 includes a frame data register 363 for transferring configuration data to memory array 370, and a command register 368 that acts as a command signal source utilized to coordinate the configuration process. The configuration data transmitted to memory array 370 is stored in memory cells 375 that are arranged in columns referred to as "frames". As described in U.S. application Ser. No. 09/374,434 and indicated in FIG. 3 by vertical arrows, memory cells 375 are connected to buffered interconnect resources 320, IOB 330 and CLBs 340-1 and 340-2 such that the logic operations and programmable connections of these configurable elements are controlled by the configuration data stored in memory array 370. For example, referring to FIG. 3, the configuration data of memory cells M21 through M28, which determines the operational state (on or off) of the pass transistors in switches 328-1 and 328-2, is stored in memory array 370.

Figure 6:
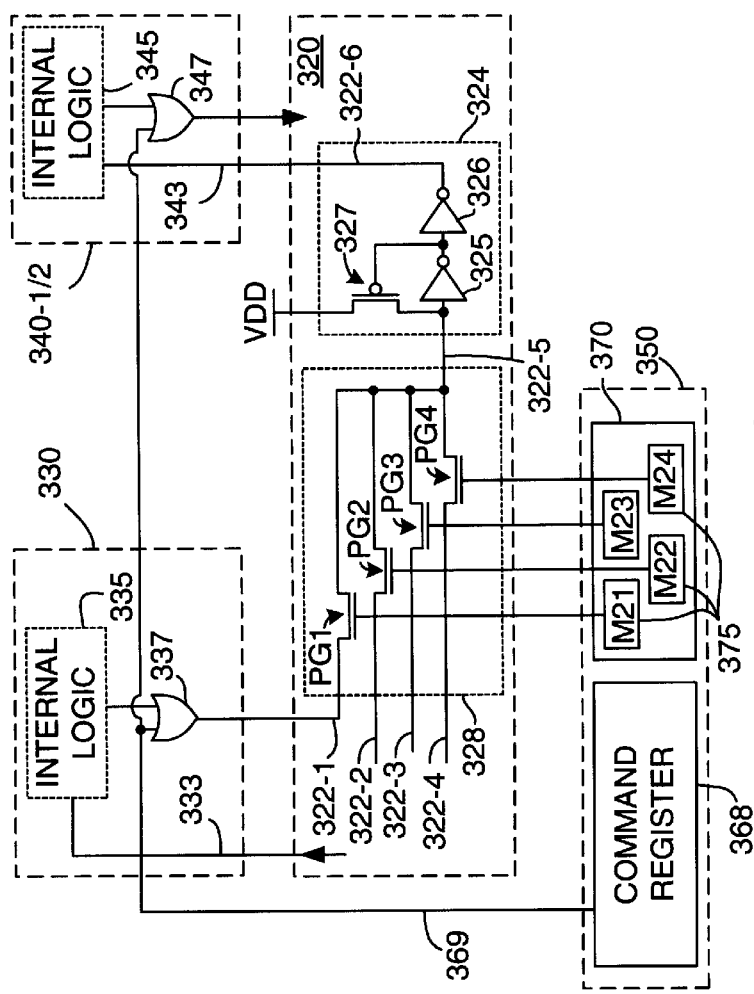
FIG. 6 is a simplified schematic diagram showing a portion of the FPGA of FIG. 5.

FIG. 6 is a simplified schematic diagram illustrating a portion of FPGA 300 that is used to describe the first embodiment of the present invention (below). Referring to FIG. 6, IOB 330 includes output driver 337, which is functionally depicted as an OR gate having a first input terminal connected to internal logic 335, a second input terminal connected to control line 369, and an output terminal connected to interconnect wire 322-1. CLB 340-1/2 includes an input terminal 343 connected to interconnect wire 322-6 that transmits data signals from interconnect resources 320 to internal logic 345. CLB 340-1/2 also includes output driver 347, which is also functionally depicted as an OR gate having a first input terminal connected to internal logic 345, a second input terminal connected to control line 369, and an output terminal connected to interconnect resources 320 (although not specifically shown, this output terminal is connected to an interconnect wire). As also indicated in FIG. 6, command register 368 is provided to generate a global high control signal onto control line 369 in accordance with the process shown in FIG. 7.

Figure 7:
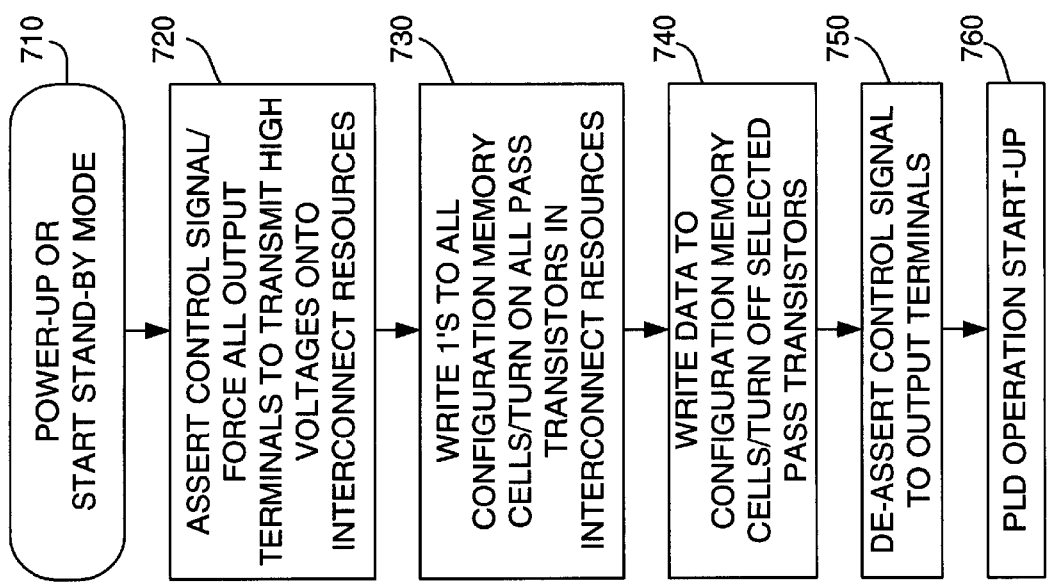
FIG. 7 is a flow diagram showing a method of configuring the FPGA of FIG. 5 in accordance with a first embodiment of the present invention.

FIG. 7 is a flow diagram showing a method of configuring FPGA 300 in accordance with a first embodiment of the present invention.

Immediately after power is applied to FPGA 300 or at the beginning of a stand-by or reconfiguration mode (Step 710), command register 368 generates a global high control signal that is applied to the input terminals of all output drivers 337 and 347 (Step 720). In response to the global high control signal, output drivers 337 and 347 generate high voltages that are transmitted to the interconnect wires of interconnect resources 320. For example, referring to FIG. 6, output driver 337 generates a high voltage on interconnect wire 322-1 in response to the global high signal received from control line 369.

Subsequently, all pass transistors in buffered interconnect resources 320 are turned on such that the high voltages generated by output drivers 337 and 347 are transmitted to all of the buffers (Step 730). For example, referring again to FIG. 6, all logic 1's are written into memory cells M21 through M24 to turn on all pass transistors PG1 through PG4 of switch 328. With pass transistor PG1 turned on, the high voltage generated by output driver 337 is passed to the input terminal of buffer 324. As described above, this high voltage causes output buffer 324 to enter a high feedback mode. In addition, buffer 324 relays the high voltage signal to subsequent interconnect wire 322-6. In this manner, the high voltage is transmitted onto all interconnect wires and to all buffers of interconnect resources 320. Signal contention is prevented in interconnect resources 320 because all of the output drivers 337 and 347 and all of the buffers 324 are biased to transmit the same high voltage.

Next, configuration data is written into configuration memory array 370 in accordance with a user's logic function (Step 740). Specifically, with all pass transistors turned on (Step 730), the process of configuring PLD 300 is performed by turning off selected pass transistors by writing, for example, logic 0 into selected memory cells of memory array 370. For example, if input terminal 343 of CLB 340-1/2 is not used in the user's logic function, then logic 0 is written to all memory cells M21 through M24, thereby turning off pass gates PG1 through PG4. As mentioned above, turning off pass transistors PG1 through PG4 isolates "unused" interconnect wire 322-5. However, because of the feedback pull-up transistor 327 in buffer 324, a high voltage is maintained in unused interconnect wire 322-5, thereby avoiding the crowbar current problem (described above) without requiring a supplemental routing solution.

After configuration is completed, the global control signal is turned off (Step 750), thereby allowing all output drivers 337 and 347 to generate signals onto "used" interconnect wires in accordance with a user's logic function that is implemented by the configuration data stored in memory array 370. Finally, PLD operations are initiated in accordance with known processes (Step 760).

Second Embodiment-Buffer with Multiple Pull-up Devices

Figure 8:
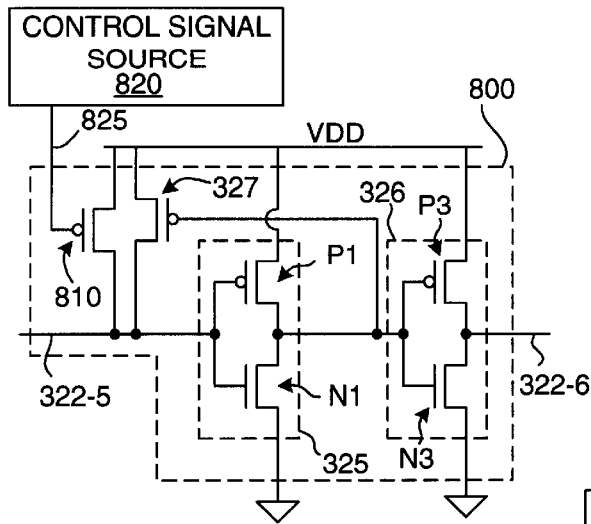
FIG. 8 is a simplified circuit diagram showing a buffer in accordance with a second embodiment of the present invention.

FIG. 8 is a simplified circuit diagram showing a buffer 800 having multiple feedback inverters in accordance with a second embodiment of the present invention. Buffer 800 may be used, for example, in place of buffer 324 in FPGA 300, shown in FIG. 6 (i.e., connected between interconnect wires 322-5 and 322-6). Similar to buffer 324, buffer 800 includes a first inverter 325 formed by a first N-channel transistor N1 and a first P-channel transistor P1, a second inverter 326 formed by a second N-channel transistor N3 and a second P-channel transistor P3, and a feedback pull-up P-channel transistor 327 having a gate connected to a node located between inverters 325 and 326. Inverters 325 and 326 and feedback transistor 327 operate in the same manner as described above with reference to buffer 324.

Unlike buffer 324, buffer 800 includes a second pull-up transistor 810 connected between the system voltage (VDD) and the input terminal of inverter 325 that is used to bias buffer 800 into the default high feedback mode in response to a special command signal during power-up of PLD 300. In the disclosed embodiment, pull-up transistor 810 is a P-channel device and is turned on by a low voltage control signal received from a control signal source 820 on control line 825. However, in other embodiments pull-up transistor 810 may be implemented as an N-channel transistor that is turned on by a high voltage control signal.

In accordance with the second embodiment, control signal source 820 generates a control signal at power-up of PLD 300 that turns on pull-up transistor 810, thereby applying a high voltage to the input terminal of first inverter 325. As in the first embodiment, this high voltage signal causes first inverter 325 to generate a low voltage that turns on P-channel feedback transistor 327, thereby pulling-up the input terminal of inverter 325 to the system voltage (VDD). Subsequent de-activation of the control signal on control line 825 turns off pull-up transistor 327, but does not affect buffer 800 (which remains in the high feedback state until a low voltage signal is transmitted on interconnect wire 322-5) or interconnect wire 322-5 (which remains at the system voltage (VDD) until a low voltage is placed onto interconnect wire 322-5 by a driver or pass transistor in accordance with a user's logic function).

Third Embodiment-Power-On/Reset Control Signal

Figure 9:
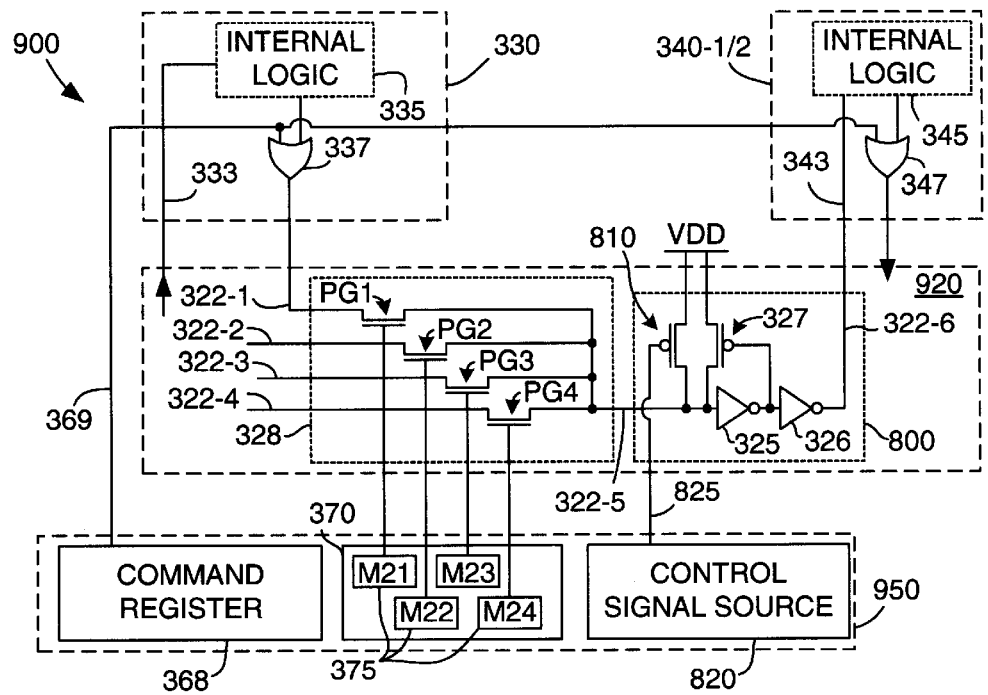
FIG. 9 is a simplified schematic diagram showing an FPGA incorporating the buffer of FIG. 8.

FIG. 9 is a simplified schematic diagram illustrating a portion of an FPGA 900 that incorporates buffers 800 (described above), and is operated in accordance with a third embodiment of the present invention (below). Portions of FPGA 900 that are identical to those of FPGA 300 (see FIG. 6) are identified with the same reference numbers for clarity. Specifically, configurable logic circuits 330 and 340-1/2, switch 328, command register 368 and memory array 370 operate in the manner described above with reference to FIG. 6.

Referring to FIG. 9, FPGA 900 differs from FPGA 300 in that it includes buffered interconnect resources 920 made up of buffers 800 (described above) that have second pull-up transistors 810. In addition, a configuration plane 950 of FPGA 900 includes control signal source 820 (see FIG. 8) for generating a control signal that is transmitted to second pull-up transistors 810 of every buffer 800 in buffered interconnect resources 920. In one embodiment, control signal source 820 generates this control signal using methods consistent with those disclosed in concurrently filed U.S. application Ser. No. 09/374,434, entitled "METHOD AND STRUCTURE FOR CONFIGURING FPGAS", which is referenced above.

Figure 10:
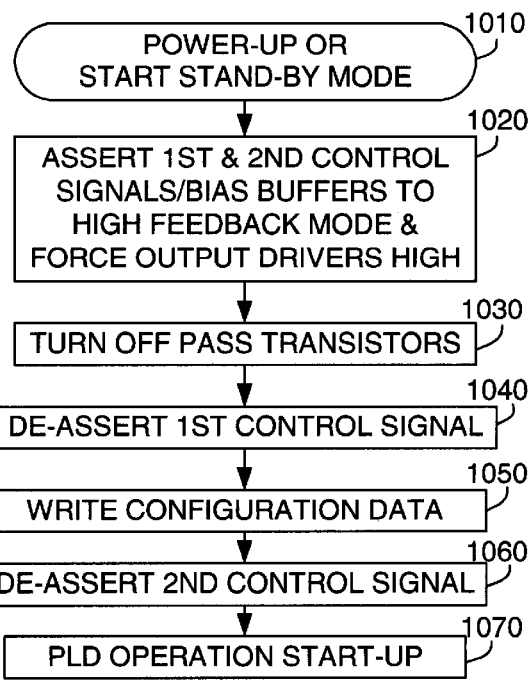
FIG. 10 is a flow diagram showing a method of configuring the FPGA of FIG. 9 in accordance with a third embodiment of the present invention.

FIG. 10 is a flow diagram showing a method of configuring FPGA 900 in accordance with a third embodiment of the present invention.

Immediately after power is applied to FPGA 900 or at the beginning of a stand-by or reconfiguration mode (Step 1010), control signal source 820 generates a first command signal that is transmitted on control line 825 to pull-up transistors 810 in every buffer 800 of interconnect resources 920, and command register 368 generates a second control signal that is applied to the input terminals of all output drivers 337 and 347 (Step 1020). In response to the first control signal, pull-up transistor 810 in every buffer 800 is turned on, thereby applying a high voltage to the input terminal of every buffer 800 such that every buffer 800 is biased into the default high feedback mode. In addition, in response to the second control signal, output drivers 337 and 347 generate high voltages that are transmitted to the interconnect wires of interconnect resources 920. For example, referring to FIG. 9, output driver 337 generates a high voltage on interconnect wire 322-1 in response to the global high signal received from control line 369. It is noted that, after Step 1020 is performed, a high voltage is applied to every interconnect wire of buffered interconnect resources 920 because every interconnect wire is either connected to a buffer 800 or driven high by output drivers 337 and 347. Consequently, even if every pass transistor in buffered interconnect resources 920 "wakes up" turned on, there is no signal contention because the same high voltage is applied to both terminals of every pass transistor.

In addition to generating the first and second control signals, all pass transistors in buffered interconnect resources 320 are turned off (Step 1030). For example, referring again to FIG. 9, all logic 0's are written into memory cells M21 through M24 to turn off (if necessary) all pass transistors PG1 through PG4 of switch 328. Note that unlike Step 730 of the first embodiment (described above), all pass transistors are initially turned off (instead of turned on) in Step 1030. This isolates all of the interconnect wires and is the primary mechanism for preventing signal contention in the fourth embodiment. In an optional embodiment, Step 1030 may be initiated before Step 1020 at device power-up, in which case the first control signal may be initially omitted. However, if Step 1030 is performed before Step 1020, the first control signal may be issued to insure against signal contention while the pass transistors are turning off, and should be issued before configuration to avoid signal contention as pass transistors are turned on to link "used" interconnect wires.

After all pass transistors in buffered interconnect resources 920 are turned off, the first control signal is de-asserted, thereby causing pull-up transistor 810 in every buffer 800 to turn off (Step 1040). As described above, this does not change the state of buffers 800, which are maintained in the default high feedback mode by feedback transistors 327, or the state of interconnect wires 322, which remain at a high voltage.

Next, configuration data is written into configuration memory array 370 in accordance with a user's logic function (Step 1050). Specifically, with all pass transistors turned off, the process of configuring PLD 900 is performed by turning on selected pass transistors by writing, for example, logic 1 into selected memory cells of memory array 370. Note that even if all pass transistors PG1 through PG4 remain off, a high voltage is maintained in unused interconnect wire 322-5 because of the feedback pull-up transistor 327 in buffer 800, thereby avoiding the crowbar current problem (described above) without requiring a supplemental routing solution.

After configuration is completed, the second global control signal is turned off (Step 1060), thereby allowing all output drivers 337 and 347 to generate signals onto "used" interconnect wires in accordance with a user's logic function that is implemented by the configuration data stored in memory array 370. Finally, PLD operations are initiated in accordance with known processes (Step 1070).

Fourth Embodiment-Global Write Enable

Figure 11:
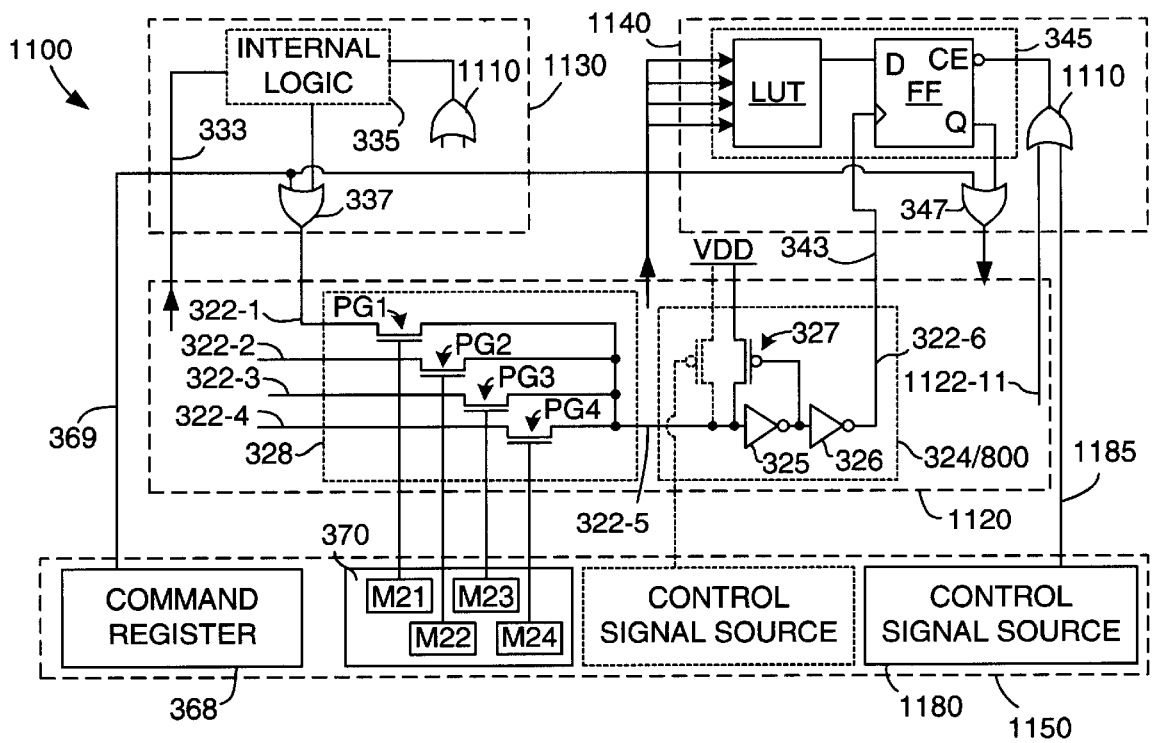
FIG. 11 is a simplified schematic diagram showing an FPGA incorporating state device control circuits.

FIG. 11 is a simplified schematic diagram illustrating a portion of an FPGA 1100 that is operated in accordance with a fourth embodiment of the present invention (below). Portions of FPGA 1100 that are identical to those of FPGAs 300 (see FIG. 6) or 900 (see FIG. 9) are identified with the same reference numbers. Specifically, switch 328, command register 368, and memory array 370 operate in the manner described above with reference to FIG. 6. In addition, either buffer 324 (FIG. 6) or buffer 800 (FIG. 8) may be utilized in FPGA 1100.

Referring to FIG. 11, FPGA 1100 differs from FPGAs 300 and 900 in that configuration plane 1150 includes a control signal source 1180 that transmits a control signal on control line 1185 in accordance with the fourth embodiment of the present invention. Control line 1185 is connected to a first input terminal of an OR gate 1110 that is provided in configurable logic circuit 1140. The second input terminal of OR gate 1110 is connected to an interconnect wire 1122-11 that is controlled in accordance with a user's logic design. The output terminal of OR gate 1110 is connected to the inverted clock enable (CE) terminal of each state device provided in configurable logic circuit 1140. In the disclosed embodiment, internal logic 345 of configurable logic circuit 1140 includes a four input look-up table LUT and a flip-flop FF that stores a data value output signal from look-up table LUT. Flip-flop FF is clocked in accordance with the user's logic function using a signal transmitted on interconnect wire 322-6. During normal operation, the clock enable terminal of flip-flop FF receives an enabling control signal from interconnect wire 1122-11, thereby allowing flip-flop FF to store data values received at its data (D) terminal in response to changes in the clock signal received at its clock terminal.

A problem with transmitting low-high voltage transitions throughout interconnect resources 1120 at the beginning and end of stand-by or reconfiguration modes of PLD 1100 is that these transitions may alter the data stored in the state devices of PLD 1100. In the example provided in FIG. 11, a low-high voltage transition on interconnect wire 322-6 may cause flip-flop FF to erroneously capture data from look-up table LUT, thereby causing the loss of data stored in flip-flop FF. While the problem described in this paragraph is indicative of the types of problems associated with the global transmission of low-high voltage transitions through interconnect resources 1120, it is not intended to be limiting—those of ordinary skill will recognize several other situations where the assertion of a low voltage, followed by a high voltage, would cause the loss of data in PLD 1100.

Figure 12:
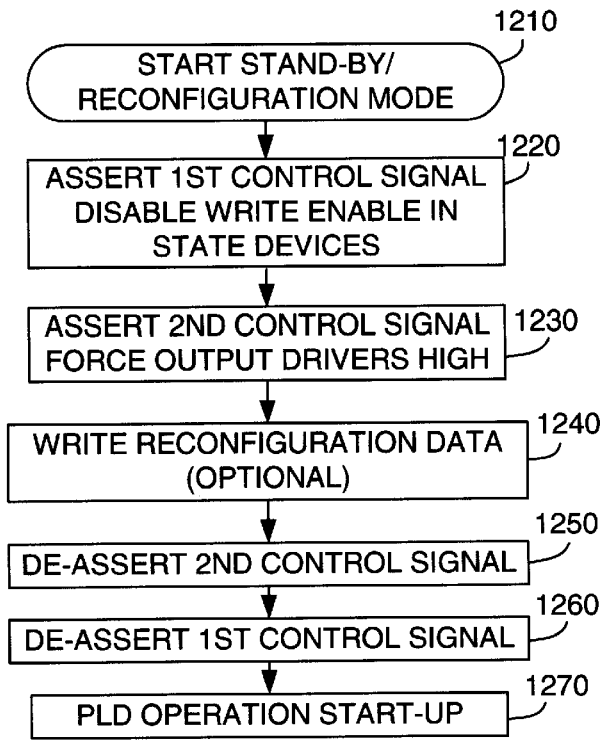
FIG. 12 is a flow diagram showing a method of configuring the FPGA of FIG. 11 in accordance with a fourth embodiment of the present invention.

FIG. 12 is a flow diagram showing a method of operating FPGA 1100 in accordance with a fourth embodiment of the present invention. In accordance with the fourth embodiment, at the beginning of a stand-by/reconfiguration mode (Step 1210), a control signal de-activates all state devices of configurable logic circuits 1130 and 1140 (e.g., transmits a high voltage to the inverted clock enable terminal of flip-flop FF), thereby preventing these state devices from changing state in response to the subsequent low-high voltage transition transmitted through interconnect resources 1120 (Step 1220). Another control signal then causes output drivers 337 and 347 of configurable logic circuits 1130 and 1140 to transmit a high voltage onto interconnect resources 1120 using the methods described above in the first and third embodiments (Step 1230). In this state, reconfiguration data may be written to configuration memory 370 to, for example, reconfigure interconnect resources 1120 (Step 1240). After reconfiguration is completed, the second control signal is de-asserted (Step 1250), thereby allowing output drivers 337 and 347 to transmit signals consistent either with the pre-standby state, or with the new logic function implemented by reconfiguration data. Subsequently, the first control signal is de-asserted (Step 1260), thereby enabling the state devices to change state in accordance with the logic signals received from interconnect resources 1120. Finally, PLD operations are resumed (Step 1270).

Because the control signal generated by control signal source 1180 de-activates the state devices of PLD 1100 prior to the stand-by/reconfiguration mode, all data stored in the state devices is preserved when the subsequent high voltage is transmitted through the interconnect resources. Therefore, PLD 1100 is able to "wake up" from a stand-by mode in the same state as when the stand-by mode begins. Alternatively, partial reconfiguration of the PLD is facilitated in which data stored in non-reconfigured portions of the PLD is retained.

Buffered Interconnect Resources Using Low Threshold Transistors

In addition to preventing the signal contention problem and crowbar current problem, the methods and structures of the present invention also facilitate the use of low threshold (low $V_{TH}$) transistors.

As mentioned above, a problem with N-channel low $V_{TH}$ transistors is that they leak significantly when they are turned off (i.e., non-conducting). This presents a particular problem in PLDS, where most of the pass transistors in the interconnect resources are typically turned off when the PLD is programmed to implement a user's logic function. The present invention obviates the problem of leakage in unused interconnect resources because, as described above, a high voltage is established and maintained on all unused interconnect wires. That is, because high voltages are applied to both terminals of the pass transistors connected between unused interconnect wires, there is no potential for leakage. Consequently, the present invention facilitates using low $V_{TH}$ transistors for pass transistors in the interconnect resources of a PLD. Of course, leakage still occurs in low $V_{TH}$ transistors that are connected to "used" interconnect wires in such a PLD, but these leakage amounts are believed to be acceptable in view of the speed benefits provided by using low $V_{TH}$ transistors.

FIGS. 13(A) and 13(B) are a simplified circuit diagrams showing a portion of buffered interconnect resources 1320 incorporating low $V_{TH}$ transistors that may be used, for example, in place of interconnect resources 320 in PLD 300 (see FIG. 3).

Switch 1328 is implemented by five four-to-one multiplexers MX1 through MX5 to selectively connect one of interconnect wires 1322-1 through 1322-16 to interconnect wire 1322-17 in accordance with well-known techniques. Referring to FIG. 13(B), which shows multiplexer MX1 in additional detail, all of the pass transistors PG21 through PG24 are formed using low $V_{TH}$ transistors (i.e., N-channel transistors having a threshold voltage that is significantly lower than other N-channel transistors located in other circuitry of the PLD incorporating buffered interconnect resources 1320). Although not shown, multiplexers MX2 through MX5 are also constructed as shown in FIG. 13(B).

Referring again to FIG. 13(A), buffered interconnect resources 1320 include buffers 1324 and 16-to-1 switches 1328 that are connected to interconnect wires 1322-1 through 1322-18 in a manner consistent with that described above. The operation of buffer 1324 and switch 1328 is essentially identical to buffers 324 and 800 and switch 328 (described above), and is not repeated here.

Similar to buffers 324 and 800 (described above), buffer 1324 is connected between interconnect wires 1322-17 and 1322-18, and includes a first inverter 1325, a second inverter 1326, a feedback transistor 1327 and an optional pull-up transistor 1340. However, buffer 1324 differs from buffers 324 and 800 in that N-channel transistor N31 of inverter 1325 is formed using a low $V_{TH}$ transistor, whereas N-channel transistor N32 of inverter 1326 is fabricated using different process parameters such that its threshold voltage is significantly higher than that of N-channel transistor N31. As described above with reference to the first through fourth embodiments, buffer 1324 maintains a default high feedback mode when connected to unused interconnect wires. In this mode, the system voltage (VDD) is applied to the gate of N-channel transistor N31, and a low voltage (e.g., ground) is applied to the gate of N-channel transistor N32. Because N-channel transistor N31 remains turned on, the leakage problem of low $V_{TH}$ transistors (described above) does not apply. However, because N-channel transistor N32 is turned off and connected between high and low voltages, N-channel transistor N32 is formed with a relatively high threshold voltage to avoid the leakage problem associated with low $V_{TH}$ transistors.

Although the present invention has been described in considerable detail with reference to certain preferred embodiments thereof, one of ordinary skill would recognize that several variations to the disclosed embodiments are possible. For example, output drivers other than OR gates 337 and 347 (FIG. 6) may be beneficially utilized in the PLDs disclosed herein in accordance with the novel aspects of the present invention. In an alternative embodiment, NAND gates or other equivalent upstream logic replaces OR gates 337 and 347, and the global control signal is a low voltage signal when asserted and high voltage when de-asserted. Therefore, the spirit and scope of the appended claims should not be limited to the description of the preferred embodiments contained herein.

I claim:

1. A method of operating a programmable logic device at device power-up, the programmable logic device including a plurality of configuration memory cells, a plurality of interconnect wires, a plurality of pass transistors connected to the plurality of interconnect wires and controlled by the plurality of configuration memory cells, and a plurality of buffers, each buffer having an input terminal connected to a first interconnect wire, and a pull-up device for pulling up the input terminal of an associated buffer when a high voltage is applied to the input terminal, wherein the method comprises:

transmitting a high voltage signal to the input terminals of all of the plurality of buffers when the programmable logic device is in one of a power-up mode and a standby mode, thereby turning on the pull-up devices of all of the plurality of buffers such that the high voltage signal is simultaneously transmitted onto all of the interconnect wires;

writing configuration data to the configuration memory cells such that a group of the plurality of pass transistors is turned off, wherein a group of said plurality of interconnect wires connected to the group of pass transistors remain pulled up by the pull-up devices of an associated group of said plurality of buffers; and after writing the configuration data, changing the mode of the programmable logic device such that the programmable logic device is no longer in the one of the power-up mode and the standby mode.

2. The method according to claim 1, wherein the programmable logic device further includes a plurality of configurable logic circuits, each configurable logic circuit including an output driver connected to an associated interconnect wire of said plurality of interconnect wires, wherein transmitting the high voltage signal comprises:

causing each of the plurality of output drivers to generate a high voltage on its associated interconnect wire; and turning on all of the plurality of pass transistors such that the high voltage generated by the output driver of each of the plurality of configurable logic circuits is transmitted to the input terminals of the plurality of buffers.

3. The method according to claim 2, wherein each of the plurality of output drivers includes a logic gate, and wherein causing the output drivers to generate a high voltage comprises asserting a global control signal that is transmitted to the logic gate of each of the plurality of output drivers.

4. The method according to claim 3,
wherein each of the configurable logic circuits includes an internal logic circuit that generates an output signal in accordance with configuration data stored in the plurality of configuration memory cells, and
wherein the method further comprises, after writing configuration data, de-asserting the global control signal, thereby causing each of the plurality of output drivers to transmit a voltage level to its associated interconnect wire in accordance with the configuration data written to the configuration memory cells.

5. The method according to claim 2, wherein turning on the pass transistors comprises writing a common logic value to all of the plurality of configuration memory cells that control the pass transistors.

6. A method of operating a programmable logic device at device power-up, the programmable logic device including a plurality of configuration memory cells, a plurality of interconnect wires, a plurality of pass transistors connected to the plurality of interconnect wires and controlled by the plurality of configuration memory cells, and a plurality of buffers, each buffer having an input terminal connected to a first interconnect wire, and a pull-up device for pulling up the input terminal of an associated buffer when a high voltage is applied to the input terminal, wherein the method comprises:
transmitting a high voltage signal to the input terminals of all of the plurality of buffers, thereby turning on the pull-up devices of all of the plurality of buffers such that the high voltage signal is simultaneously transmitted onto all of the interconnect wires; and
writing configuration data to the configuration memory cells such that a group of the plurality of pass transistors is turned off, wherein a group of said plurality of interconnect wires connected to the group of pass transistors remain pulled up by the pull-up devices of an associated group of said plurality of buffers,
wherein each of the plurality of buffers includes a second pull-up device connected between the input terminal of said each buffer and a system voltage source, and
wherein transmitting the high voltage signal comprises asserting a first global control signal having a high voltage that is transmitted to a gate of the second pull-up device of the plurality of buffers.

7. The method according to claim 6, wherein the programmable logic device further includes a plurality of configurable logic circuits, each configurable logic circuit including an output driver connected to an associated interconnect wire of said plurality of interconnect wires, wherein the method further comprises, before writing configuration data:
asserting a second global control signal that is transmitted to each of the plurality of output drivers, thereby causing the output driver of each of the plurality of configurable logic circuits to generate a high voltage on its associated interconnect wire; and
turning off the plurality of pass transistors.

8. The method according to claim 7, further comprising:
de-asserting the first global control signal before writing the configuration data; and
de-asserting the second global control signal after writing the configuration data.

9. The method according to claim 6, wherein the programmable logic device further includes a plurality of configurable logic circuits, each configurable logic circuit including an output driver connected to an associated interconnect wire of said plurality of interconnect wires, wherein the method further comprises, before writing configuration data:
turning off the plurality of pass transistors; and
asserting a second global control signal that is transmitted to each of the plurality of output drivers, thereby causing the output driver of each of the plurality of configurable logic circuits to generate a high voltage on its associated interconnect wire.

10. The method according to claim 9, further comprising:
de-asserting the first global control signal before writing the configuration data; and
de-asserting the second global control signal after writing the configuration data.

11. A programmable logic device having a control signal source and buffered interconnect resources including a plurality of interconnect wires and a plurality of buffers, each buffer being connected between adjacent interconnect wires, each buffer comprising:
a first inverter having an input terminal and an output terminal;
a first pull-up transistor connected between a high voltage source and the input terminal of the first inverter, wherein a gate terminal of the first pull-up transistor is connected to the output terminal of the first inverter; and
a second pull-up transistor connected between the high voltage source and the input terminal of the first inverter;
wherein the gate terminals of the second pull-up transistors of the plurality of buffers are connected to the control signal source.

12. The programmable logic device according to claim 11, wherein the control signal source comprises means for generating a global control signal that causes the second pull-up transistor of each buffer to turn on, thereby causing the first inverter to transmit a low voltage signal to the gate of the first pull-up transistor in each buffer.

13. The programmable logic device according to claim 11, wherein each buffer further comprises a second inverter having an input terminal connected to the output terminal of the first inverter.

14. A programmable device having buffered interconnect resources including a plurality of interconnect wires and a plurality of buffers, each buffer being connected between associated pairs of first and second interconnect wires, each buffer comprising:
a first inverter including a first N-channel transistor having a gate terminal connected to a first interconnect wire, the first N-channel transistor also having a first terminal connected to ground;
a second inverter including a second N-channel transistor having a gate terminal connected to a second terminal of the first N-channel transistor, the second N-channel transistor also having a first terminal connected to ground and a second terminal connected to a second interconnect wire;
a first pull-up transistor connected between a high voltage source and the first interconnect wire, the first pull-up transistor having a gate terminal connected to the output terminal of the first inverter; and a second pull-up transistor connected between the high voltage source and the first interconnect wire, wherein a threshold voltage of the first N-channel transistor is less than a threshold voltage of the second N-channel transistor.

15. A method of operating a programmable logic device (PLD), the PLD comprising an output driver, an interconnect line driven by the driver, a switch coupled to the interconnect line, and a buffer having an input terminal coupled to the switch, the switch comprising a plurality of pass transistors, the switch programmably providing a signal on the interconnect line to the input terminal of the buffer, the method comprising:

placing the PLD in one of a power-up mode and a standby mode;

asserting a first control signal to the output driver such that the output driver forces the interconnect line high;

configuring the switch to turn on all of the pass transistors;

configuring the switch to turn off selected ones of the pass transistors in accordance with a user's logic function;

de-asserting the first control signal to allow the interconnect line to assume a voltage level in accordance with the user's logic function; and placing the PLD in an operating mode.

16. A method of operating a programmable logic device (PLD), the PLD comprising an output driver, an interconnect line driven by the driver, a switch coupled to the interconnect line, and a buffer having an input terminal coupled to the switch, the switch comprising a plurality of pass transistors, the switch programmably providing a signal on the interconnect line to the input terminal of the buffer, a first high voltage level being provided to the input terminal of the buffer at a second lower voltage level, the buffer comprising a first pull-up transistor having a gate terminal connected to an output terminal of an inverter that when enabled pulls the input terminal of the buffer to the first high voltage level, and a second pull-up transistor connected between the input terminal of the buffer and the first high voltage source, the method comprising:

asserting a first control signal to enable the second pull-up transistor of the buffer;

asserting a second control signal to the output driver such that the output driver forces the interconnect line high;

configuring the switch to turn off all of the pass transistors;

de-asserting the first control signal to disable the second pull-up transistor of the buffer;

configuring the switch to turn on selected ones of the pass transistors in accordance with a user's logic function; and de-asserting the second control signal to allow the interconnect line to assume a voltage level in accordance with a user's logic function.

* * * * *